(12) United States Patent
Hata et al.

(10) Patent No.: US 11,069,589 B2
(45) Date of Patent: Jul. 20, 2021

(54) CIRCUIT BOARD AND CIRCUIT MODULE

(71) Applicant: TAIYO YUDEN CO., LTD., Tokyo (JP)

(72) Inventors: Yutaka Hata, Tokyo (JP); Masashi Miyazaki, Tokyo (JP); Yuichi Sugiyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 16/502,866

(22) Filed: Jul. 3, 2019

(65) Prior Publication Data

US 2020/0013690 A1 Jan. 9, 2020

(30) Foreign Application Priority Data

Jul. 6, 2018 (JP) .............................. JP2018-128928

(51) Int. Cl.
| | |
|---|---|
| *H01L 23/31* | (2006.01) |
| *H05K 3/46* | (2006.01) |
| *H05K 1/02* | (2006.01) |
| *H01L 23/00* | (2006.01) |
| *H05K 1/18* | (2006.01) |

(52) U.S. Cl.
CPC .......... *H01L 23/3121* (2013.01); *H01L 24/48* (2013.01); *H01L 24/97* (2013.01); *H05K 1/0201* (2013.01); *H05K 1/181* (2013.01); *H05K 3/46* (2013.01); *H01L 2224/48091* (2013.01); *H01L 2224/48227* (2013.01); *H01L 2924/181* (2013.01); *H01L 2924/1904* (2013.01)

(58) Field of Classification Search
CPC ..... H01L 23/3121; H01L 24/48; H01L 24/97; H01L 24/73; H01L 24/32; H01L 33/62; H01L 24/16; H01L 25/065; H01L 23/492; H01L 23/49894; H01L 21/4871; H01L 21/4853; H01L 23/5383; H01L 27/14636; H01L 27/14618; H05K 3/46; H05K 1/0201; H05K 1/181; H05K 3/4608; H05K 1/0271; H05K 1/05; H05K 1/0283; H05K 1/0366; H05K 1/111; H05K 1/184; H05K 3/306; H05K 3/284; H05K 1/0298
USPC .... 257/737, E21.705, E23.07; 438/107, 108, 438/360, 118
See application file for complete search history.

(56) References Cited

U.S. PATENT DOCUMENTS

| | | | |
|---|---|---|---|
| 7,842,541 B1* | 11/2010 | Rusli | H01L 23/49816 438/106 |
| 2005/0212107 A1* | 9/2005 | Kato | H01L 25/165 257/678 |
| 2009/0056987 A1* | 3/2009 | Nomiya | H01L 23/15 174/255 |

(Continued)

FOREIGN PATENT DOCUMENTS

JP 2004-163722 A 6/2004

*Primary Examiner* — Mouloucoulaye Inoussa
(74) *Attorney, Agent, or Firm* — Chen Yoshimura LLP (57) ABSTRACT

Provided is a circuit board including: a metal core layer having a first main surface capable of supporting a mounting component and a second main surface which is opposite to the first main surface; a first exterior coating base material which is arranged facing the first main surface; and a second exterior coating base material which is arranged facing the second main surface and includes a heat dissipation layer having a via which is connected to the second main surface.

9 Claims, 4 Drawing Sheets

(56) References Cited

U.S. PATENT DOCUMENTS

| | | | | |
|---|---|---|---|---|
| 2012/0133427 | A1* | 5/2012 | Kim | H01L 25/16 |
| | | | | 327/564 |
| 2016/0338202 | A1* | 11/2016 | Park | H01L 24/00 |
| 2018/0053036 | A1* | 2/2018 | Baek | H01L 21/561 |
| 2019/0104237 | A1* | 4/2019 | Sugiyama | H05K 1/0298 |
| 2019/0181097 | A1* | 6/2019 | Cheah | H01L 25/18 |

* cited by examiner

CIRCUIT BOARD AND CIRCUIT MODULE

CROSS REFERENCE TO RELATED APPLICATIONS

This application claims the benefit of Japanese Priority Patent Application JP 2018-128928 filed Jul. 6, 2018, the entire contents of which are incorporated herein by reference.

BACKGROUND OF THE INVENTION

The present disclosure relates to a circuit board and a circuit module which are excellent in heat dissipation characteristic.

SUMMARY OF THE INVENTION

Demands on electronic apparatuses have been varied along with expansion of the information communication industry and demands for early development and mass production start are increased. For example, Japanese Patent Application Laid-open No. 2004-163722 has disclosed a substrate with a built-in component including a built-in surface emitting semiconductor laser, a built-in surface emitting light-receiving element, a built-in electronic device, and the like.

In recent years, in a circuit board which is mounted on a sophisticated electronic apparatus, high density mounting, reduction in size and thickness, and modularization of functional blocks are in progress. It is desirable to provide an effective measure against heat dissipation of a circuit board in order to prevent degradation and malfunction caused by heat generation of components.

In view of the above-mentioned circumstances, the present disclosure has been made for providing a circuit board and a circuit module which are capable of achieving an improvement in heat dissipation characteristic.

In accordance with an embodiment of the present disclosure, there is provided a circuit board including a core base material, a first exterior coating base material, and a second exterior coating base material.

A core base material includes a metal core layer. The metal core layer includes a first main surface capable of supporting a mounting component and a second main surface which is opposite to the first main surface.

The first exterior coating base material which is arranged facing the first main surface and includes a recess that stores the mounting component mounted on the first main surface.

The second exterior coating base material is arranged facing the second main surface and includes a heat dissipation layer having a via which is connected to the second main surface.

In the circuit board, the heat dissipation layer which is thermally connected to the core layer that supports the mounting component via the via is provided. Therefore, the heat dissipation characteristic of the core layer can be improved and deterioration and malfunction caused by heat generation of the mounting component can be prevented.

The via may include a plurality of via parts which are connected to a plurality of parts of the second main surface.

With this configuration, heat transfer from the core layer to the heat dissipation layer becomes more effective.

The first exterior coating base material may include a recess capable of storing the mounting component and a first wiring layer. The first wiring layer includes a connection terminal which is electrically connected to the mounting component stored in the recess and a heat collecting terminal which has an area larger than an area of the connection terminal and is connected to at least one electrode of a temperature measurement element mountable on the first exterior coating base material.

With this configuration, heat generated by the core layer can be effectively collected, and thus the temperature measurement accuracy of the core base material using the temperature measurement element is improved.

The second exterior coating base material may further include a second wiring layer. The second wiring layer is arranged facing the heat dissipation layer and is electrically insulated from the core layer and the heat dissipation layer.

With this configuration, the core layer and the second wiring layer connected to different potential sources.

The first exterior coating base material may be a multilayer wiring base material.

The core base material may further include a flexible wiring member having an aperture for storing the core layer.

In accordance with an embodiment of the present disclosure, there is provided a circuit module including a heat generating element, a core base material, a first exterior coating base material, and a second exterior coating base material.

The core base material includes a metal core layer having a first main surface on which the heat generating element is mounted and a second main surface which is opposite to the first main surface.

The first exterior coating base material is arranged facing the first main surface, has a recess that stores the heat generating element, and includes a first wiring layer which is electrically connected to the heat generating element.

The second exterior coating base material is arranged facing the second main surface and includes a heat dissipation layer having a via which is connected to the second main surface.

The circuit module may further include a temperature measurement element. The first wiring layer may include a connection terminal which is electrically connected to the heat generating element and a heat collecting terminal which has an area larger than the connection terminal and is connected to at least one electrode of the temperature measurement element.

The heat generating element may be a semiconductor light-emitting element.

The second exterior coating base material may further include a second wiring layer. The second wiring layer is arranged facing the heat dissipation layer and is electrically insulated from the core layer and the heat dissipation layer.

As described above, in accordance with the present disclosure, it is possible to achieve an improvement in heat dissipation characteristic.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, an embodiment of the present disclosure will be described with reference to the drawings.

Figure 1:
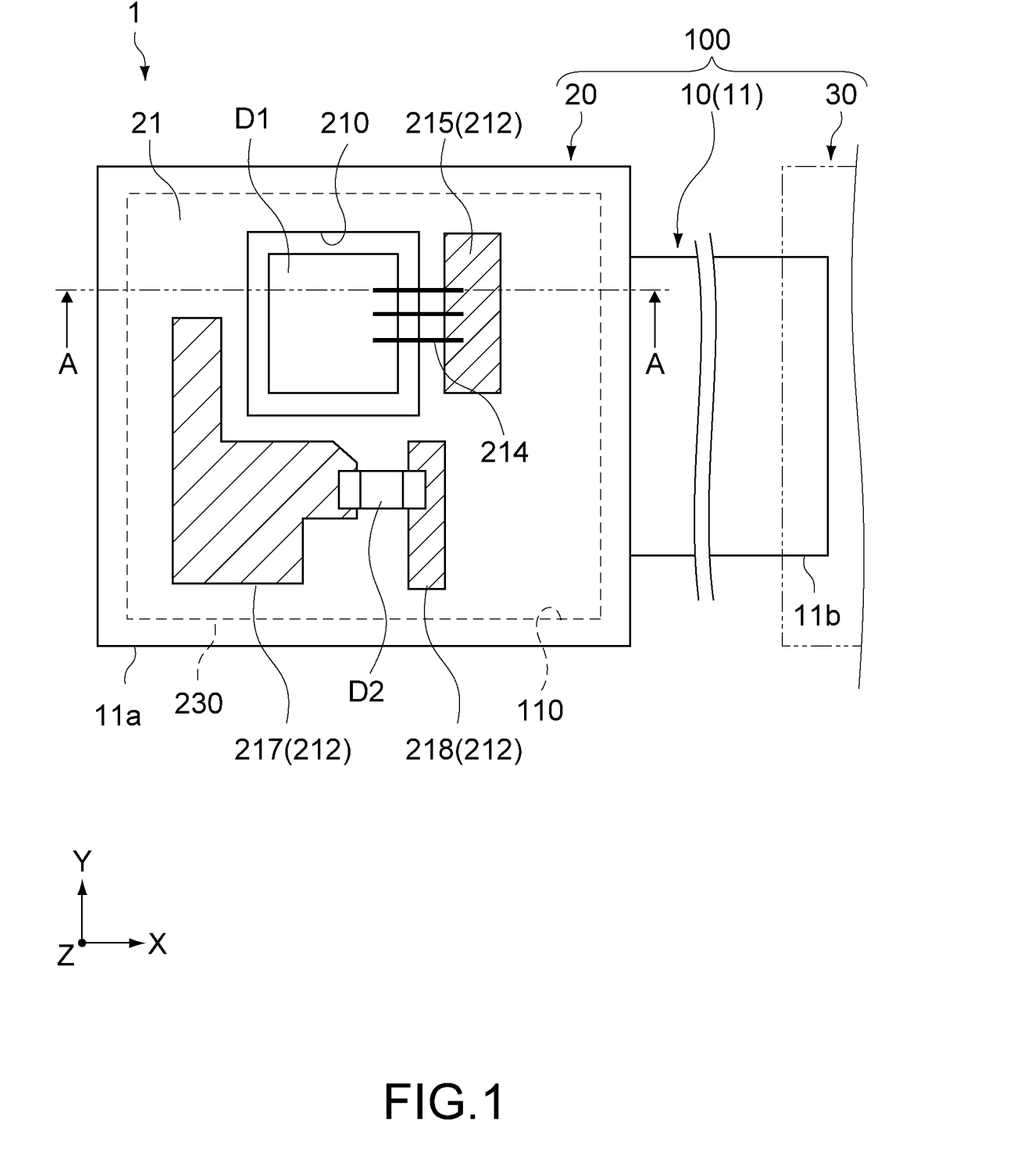
FIG. 1 is a schematic plan view showing a circuit module including a circuit board according to an embodiment of the present disclosure.
Figure 2:
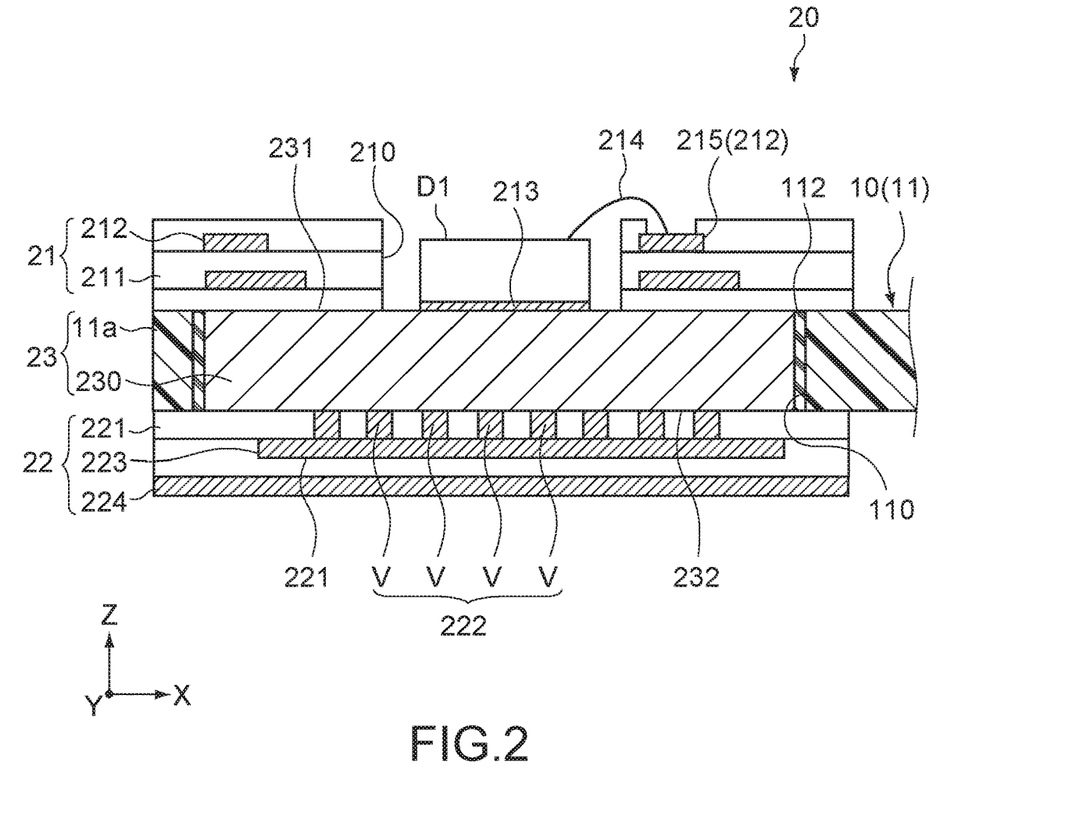
FIG. 2 is a schematic cross-sectional view taken along the line A-A of FIG. 1.

FIG. 1 is a schematic plan view showing a circuit module 1 including a circuit board 100 according to an embodiment of the present disclosure. FIG. 2 is a schematic cross-sectional view taken along the line A-A in FIG. 1.

In the figures, the X-axis, the Y-axis, and the Z-axis indicate three axis directions orthogonal to one another and the Z-axis corresponds to a direction of thickness of the circuit board 100.

Configuration of Circuit Board

The circuit board 100 according to this embodiment includes a first board body 10, a second board body 20, and a third board body 30.

The first board body 10 is constituted by a flexible wiring base material 11 that mechanically and electrically connects the second board body 20 to the third board body 30 and forms a flexible portion in the circuit board 100. The second board body 20 and the third board body 30 form a rigid portion in the circuit board 100. The second board body 20 is configured as a supporting substrate on which various electronic components such as a light-emitting element D1 and a temperature measurement element D2 can be mounted. The third board body 30 is connected to a control board of an electronic apparatus (not shown). It should be noted that although the circuit board 100 is configured to be integral with the third board body 30, the circuit board 100 may be typically configured as a separate component to be connected to the third board body 30 via a connection part such as a connector.

First Board Body

The flexible wiring base material 11 constituting the first board body 10 typically has a longitudinal direction in the X-axis direction and a width direction in the Y-axis direction. One end portion (first end portion 11a) in the longitudinal direction forms a part of a core base material of the second board body 20. The other end portion (second end portion 11b) forms a part of the third board body 30.

The flexible wiring base material 11 is formed of a laminate including a resin core, wiring layers provided on both surfaces thereof, and insulating layers that cover the wiring layers. The resin core is formed of, for example, a flexible plastic film having a single layer or multiple layers made of polyimide, polyethylene terephthalate, or the like. The wiring layers is typically formed of a metal material such as copper and aluminum. Further, the insulating layer is formed of a flexible plastic film made of polyimide or the like including an adhesive layer. Parts of the wiring layers are electrically connected to each other via a through-hole or via provided at an appropriate position of the resin core. The wiring layers of the flexible wiring base material 11 are not limited to the two layers. A single layer may be employed. Alternatively, three or more layers may be employed.

Second Board Body

The second board body 20 includes a laminate structure of a first exterior coating base material 21, a second exterior coating base material 22, and a core base material 23.

Core Base Material

The core base material 23 includes a metal core layer 230. The core layer 230 is formed of a metal material. The core layer 230 is typically made of copper or an alloy thereof, aluminum or an alloy thereof, or iron or an alloy thereof. The kind of metal is not limited thereto. A material having a relatively high thermal conductivity, for example, copper or an alloy thereof is favorable among them.

The core layer 230 is formed of a metal plate having a first main surface 231 capable of supporting the mounting component (light-emitting element D1) and a second main surface 232 opposite thereto. The shape of the core layer 230 as viewed in a plan view is not particularly limited. The core layer 230 is typically rectangular, though not limited thereto. The core layer 230 may have a circular shape, an elliptical shape, polygonal shape such as a pentagonal shape, or the like. The core layer 230 has a function as a core material (reinforced layer) applying rigidity for securing a high planarity or flatness to the second board body 20. The core layer 230 also has a function as a heat sink that absorbs heat generated when the light-emitting element D1 is driven. The thickness of the core layer 230 is not particularly limited. For example, the thickness of the core layer 230 is 100 μm or more and 400 μm or less. The core layer 230 may have the same thickness as the flexible wiring base material 11. Alternatively, the core layer 230 may be thicker or thinner than the flexible wiring base material.

The core layer 230 is stored in an aperture 110 provided at the first end portion 11a of the flexible wiring base material 11. The aperture 110 is formed in a shape corresponding to the shape of the core layer 230. In this example, the aperture 110 is formed in a rectangular shape (see FIG. 1). Therefore, the first end portion 11a of the flexible wiring base material 11 is formed in a rectangular frame shape. The aperture 110 has an area larger than an area of the core layer 230 and an space between an inner peripheral surface of the aperture 110 and an outer peripheral surface of the core layer 230 is filled with an adhesive resin material 112 (see FIG. 2). Accordingly, the core base material 23 in which the first end portion 11a of the flexible wiring base material 11 and the core layer 230 are integrally joined with each other is formed.

The first exterior coating base material 21 and the second exterior coating base material 22 have a rectangular shape as viewed in a plan view, which corresponds to the shape of the first end portion 11a of the flexible wiring base material 11. The first exterior coating base material 21 and the second exterior coating base material 22 are formed having an area larger than an area of the first and second main surfaces 231, 232 of the core layer 230 (see FIG. 1). The first exterior coating base material 21 is arranged facing the first main surface 231 of the core layer 230. The second exterior coating base material 22 is arranged facing the second main surface 232 of the core layer 230.

First Exterior Coating Base Material

The first exterior coating base material 21 is formed of a wiring base material in which an insulating layer 211 (first insulating layer) and a wiring layer 212 (first wiring layer) are alternately stacked. In this embodiment, the first exterior coating base material 21 is formed of a multi-layer wiring base material having two or more wiring layers. Alternatively, the first exterior coating base material 21 may be formed of a single-layer wiring base material. The insulating layer 211 is typically made of a resin material such as a glass epoxy-based resin and a bismaleimide-triazine resin (BT resin). The wiring layer 212 is made of a metal material such as copper and aluminum. The wiring layer 212 is patterned in a predetermined shape in an inner layer and a front layer of the first exterior coating base material 21.

The first exterior coating base material 21 has a recess (or a storage portion) 210 that stores the mounting component (light-emitting element D1) which is mounted on the first main surface 231 of the core layer 230. The recess 210 is a rectangular aperture formed having a depth such that the first main surface 231 of the core layer 230 is exposed to the outside (see FIG. 1). The size and position of the recess 210 are not particularly limited. Any size and position can be employed for the recess 210 as long as the recess 210 can store the light-emitting element D1 and the recess 210 located in a region in which the core layer 230 is placed. Further, the number of elements to be stored is also not limited to one and may be plural. The recess 210 is formed having a depth larger than a height (thickness) dimension of the light-emitting element D1 as shown in FIG. 2. The depth of the recess 210 is not limited thereto as a matter of course.

A semiconductor light-emitting element is typically used as the light-emitting element D1. Examples of the semiconductor light-emitting element can include a light-emitting diode, a laser diode, and the like. In this embodiment, a vertical cavity surface emitting laser (VCSEL) is employed and is stored in the recess 210 so as to emit light in a direction perpendicular to the first main surface 231 of the core layer 230.

It should be noted that an element mounted on the recess 210 is not limited to the light-emitting element D1. Another semiconductor element or semiconductor package component such as an image sensor and a power-based semiconductor element (e.g., a transistor or diode) can be employed. In particular, a heat generating element is favorable.

In this embodiment, the light-emitting element D1 has a cathode on a front surface (upper surface in FIG. 2) and an anode on a back surface (lower surface in FIG. 2). The cathode is electrically connected to a first connection terminal 215 via one or more bonding wires 214. The anode is electrically connected to the first main surface 231 of the core layer 230 via an electrically conductive layer 213. The first connection terminal 215 forms a part of the wiring layer 212 in the first exterior coating base material 21 and is arranged on a surface of the first exterior coating base material 21 outside the recess 210. The electrically conductive layer 213 is made of, for example, solder, a silver paste, or an electrically conductive adhesive. the light-emitting element D1 may be mounted on the first main surface 231 by a flip chip method, for example, not via the electrically conductive layer 213.

The position of the electrode of the light-emitting element D1 is not limited to the above example. An element structure in which the anode and the cathode are arranged on the front surface of the element may be employed. In this case, the anode and the cathode are each bonded to a predetermined connection terminal with a wire. Also in this case, the back surface of the element is joined with the core layer 230 via an electrically conductive layer. A heat transfer path from the element to the core layer 230 can be thus formed.

As shown in FIG. 1, the wiring layer 212 located on a front layer of the first exterior coating base material 21 includes the first connection terminal 215 connected to the light-emitting element D1 and a pair of second connection terminals 217, 218 connected to the temperature measurement element D2. The first connection terminal 217 is electrically connected to the cathode of the light-emitting element D1 via the plurality of bonding wires 214. The pair of second connection terminals 217, 218 are connected to both external electrodes of the temperature measurement element D2 by soldering.

An semiconductor element capable of electrically detecting a temperature change, for example, a thermistor is employed as the temperature measurement element D2. The temperature measurement element D2 functions as a temperature management element for measuring an amount of heat generation by driving of the light-emitting element D1 and stopping or limiting the operation of the light-emitting element D1 when detecting a predetermined temperature or more.

In this embodiment, the second connection terminals 217, 218 are opposed to the core layer 230 with the insulating layer 211 interposed therebetween and the one terminal 217 of them has a larger area than the other terminal 218. Further, the one terminal 217 of the second connection terminals 217, 218 may be formed having the same area as the first connection terminal 215. In this embodiment, the terminal 217 is configured as a heat collecting terminal formed having a larger area than the first connection terminal 215 (see FIG. 1). Accordingly, the heat receiving efficiency of the terminal 217 from the core layer 230 increases. Therefore, the measurement accuracy of the ambient temperature of the light-emitting element D1 by the temperature measurement element D2 is improved and the light-emitting element D1 can be effectively protected from deterioration and damage caused by heat generation. The second connection terminal 217 for heat collection is favorably arranged near the recess 210. Accordingly, the detection accuracy of the temperature of the light-emitting element D1 is improved. The shape of the second connection terminal 217 is also not limited to the example as shown in FIG. 1 (to be described later).

Second Exterior Coating Base Material

The second exterior coating base material 22 includes an insulating layer 221 that covers the second main surface 232 of the core layer 230 and a heat dissipation layer 223 having a via 222 connected to the second main surface 232. The via 222 is formed inside the insulating layer 221 and includes a plurality of via parts V connected to a plurality of parts of the second main surface 232. The heat dissipation layer 223 functions as a heat dissipation line that transfers heat the light-emitting element D1 absorbed by the core layer 230 outside the core layer 230. Further, the heat dissipation layer 223 functions as an electric power supply line connected to the anode of the light-emitting element D1 via the core layer 230.

The heat dissipation layer 223 is formed in a conductive pattern of a solid film formed on the surface of the insulating layer 221. The via 222 and the heat dissipation layer 223 are made of the same metal material and is typically a copper plating layer. That is, after a plurality of through-holes is formed at an appropriate location of the insulating layer 221 covering the second main surface 232 of the core layer 230, a copper plating layer is formed so as to fill those through-holes. The plating method is not particularly limited. Electrolytic plating may be employed. Alternatively, non-electrolytic plating may be employed. By patterning a copper plating layer on the insulating layer 221 in an appropriate shape, the heat dissipation layer 223 is formed. The via 222 is constituted by the plurality of via parts V. Therefore, as compared to a case where the via 222 is constituted by a single layer having a large area, a via having a predetermined thickness (height) can be stably formed.

The second exterior coating base material 22 further includes a second wiring layer 224. The second wiring layer 224 is arranged above the insulating layer 221 covering the heat dissipation layer 223. The second wiring layer 224 is configured as a ground line which is connected to a ground potential, for example. That is, the second wiring layer 224 is configured as a wiring layer electrically separated (insulated) from the core layer 230 and the heat dissipation layer 223.

The second wiring layer 224 may be formed of a metal film such as a copper foil. Alternatively, the second wiring layer 224 may be formed of a relatively thick metal plate. The second wiring layer 224 may be joined with a casing (not shown) via an electrically conductive adhesive, for example.

Action of Circuit board

In the circuit board 100 according to this embodiment which is configured in the above-mentioned manner, the core base material 23 of the second board body 20 includes the metal core layer 230. The one main surface (first main surface 231) of the core layer 230 is configured as a support surface that supports the light-emitting element D1. Therefore, as compared to a case where the core layer is made of a resin, the heat dissipation characteristic of the light-emitting element D1 which is the heat generating element can be improved. Further, since the core layer 230 is made of metal, the core layer 230 is highly resistant against deformation and is capable of maintaining a high flatness. Therefore, a desired light-emitting characteristic can be stably secured while reducing variations in surface accuracy of the light-emitting element D1.

Further, in the circuit board 100 according to this embodiment, the heat dissipation layer 223 connected to the core layer 230 through the via 222 is provided. Therefore, heat of the core layer 230 can be discharged outside via the heat dissipation layer 223. Accordingly, it is possible to achieve a further improvement in heat dissipation characteristic of the light-emitting element D1. Deterioration of the light-emitting element D1 due to heat generation can be effectively suppressed.

In addition, the second connection terminal 217 on which the temperature measurement element D2 is mounted is formed having a relatively wide area as the heat collecting terminal. It is thus possible to reliably detect a temperature increase of the core layer 230. Accordingly, the temperature of the light-emitting element D1 can be easily estimated and the effect of preventing deterioration of the light-emitting element D1 due to heat can be improved. It should be noted that also regarding the other second connection terminal 218, it may be also formed having a electrode area larger than an area of the first connection terminal 215.

In addition, the heat dissipation layer 223 is electrically insulated from the second wiring layer 224 which is the ground line. Therefore, stable driving of the light-emitting element D1 can be secured. That is, the ground line of the electronic apparatus on which the circuit module 1 is mounted is commonly connected to the ground potential. Therefore, the ground potential may fluctuate at some apparatus operation timings. Also in such a case, the electric power supply line of the light-emitting element D1 (heat dissipation layer 223, core layer 230) is separated from the ground line (second wiring layer 224). Therefore, the light-emitting element D1 can be more stably operated.

Figure 3:
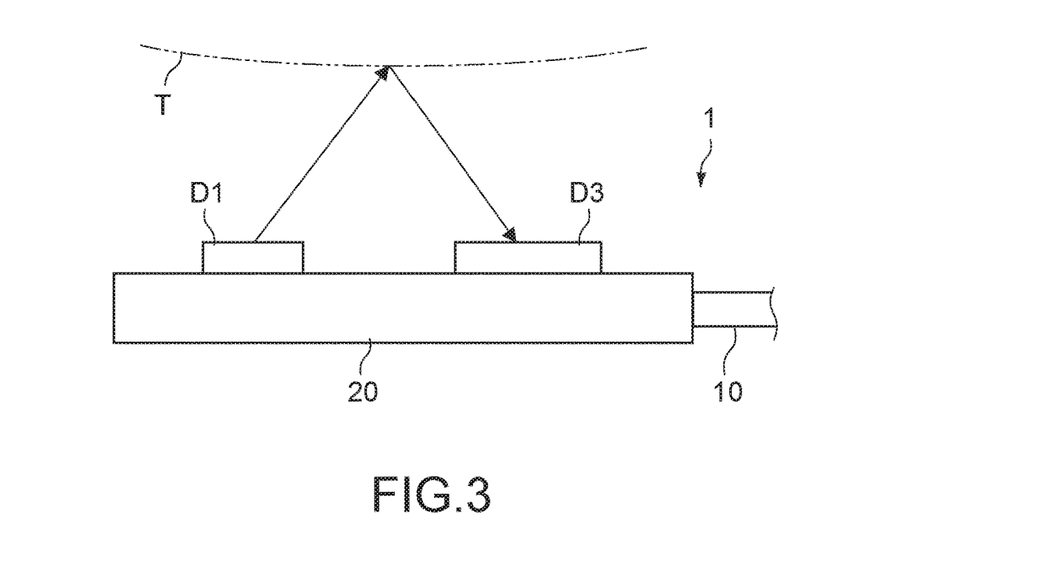
FIG. 3 is a schematic side view showing an application example of the circuit board.

In the circuit module 1 according to this embodiment, the light-emitting element D1 can be configured as a distance measurement sensor or a face authentication device. In this case, as shown in FIG. 3, a light-receiving sensor D3 is mounted on the second board body 20. The light-receiving sensor D3 receives light which is emitted from the light-emitting element D1 and reflected on a target object T. In this case, an optical element such as a diffraction grating that divides the optical axis is further mounted on a light-emitting portion of the light-emitting element D1. A plurality of reflection light patterns can be thus acquired using the single light-emitting device.

Modified Examples

Hereinabove, the embodiment of the present disclosure has been described. The present disclosure is not limited only to the above-mentioned embodiment and various modifications can be made as a matter of course.

For example, in the above-mentioned embodiment, a so-called rigid flexible substrate including the rigid portion and the flexible portion has been shown as the circuit board 100. Alternatively, the circuit board 100 may be formed of a single rigid substrate. In this case, the metal core layer is built in a general-purpose resin substrate such as a glass epoxy substrate.

Further, a cavity capable of storing electronic components such as an IC and a passive component and a through-hole for interlayer connection may be formed in the metal core layer 230 that constitutes the core base material 23.

In addition, the electrode shape of the second connection terminal 217 for heat collection on which the temperature measurement element D2 is mounted can be set as appropriate. For example, forms as shown in FIGS. 4A and 4B may be employed.

Figure 4A:
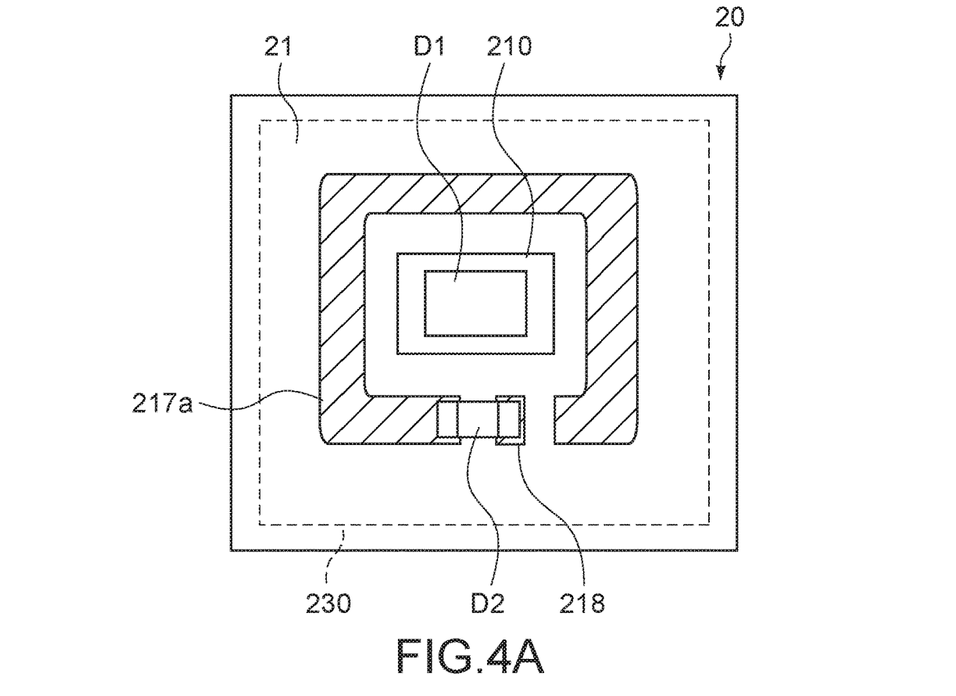
FIGS. 4A-4B are schematic plan view showing another embodiment of a heat collecting terminal in the circuit board.
Figure 4B:
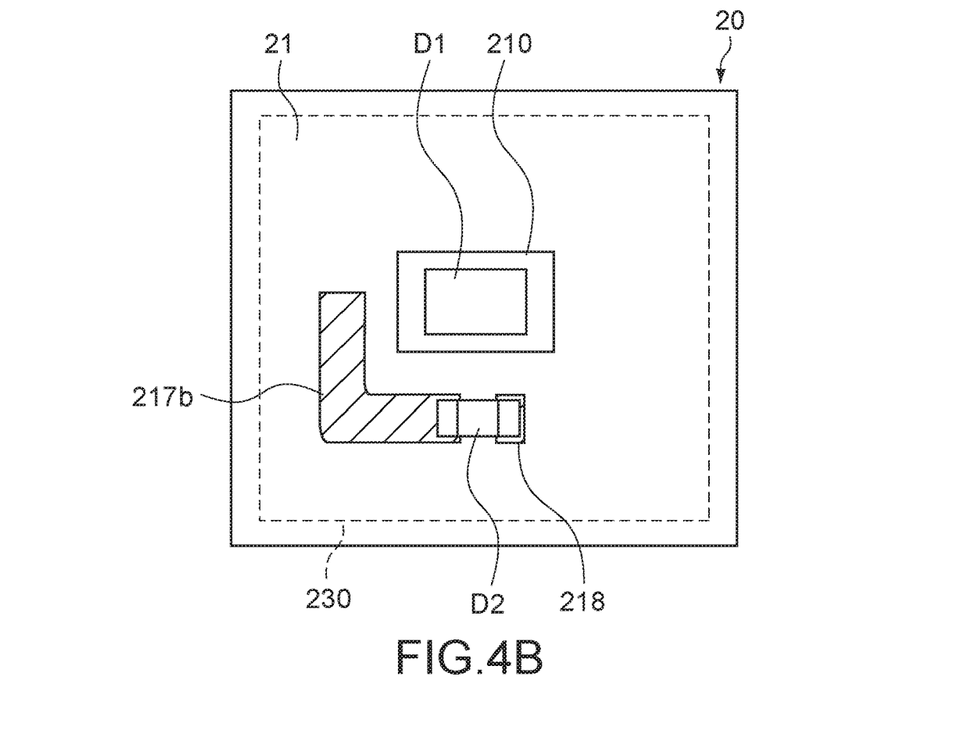

A second connection terminal 217a shown in FIG. 4A is formed in an annular shape around the recess 210 that stores the light-emitting element D1. Moreover, a second connection terminal 217b shown in FIG. 4B is formed as a part of the annular shape as an example. With both the forms, the second connection terminal 217a, 217b is arranged near the light-emitting element D1 which is a heat generation source, and thus the property of collecting heat from the core layer 230 can be improved.

It should be noted that with the rigid flexible substrate, the temperature measurement element D2 may be arranged in an arbitrary region between the light-emitting element and the flexible portion. Heat is not easily released from that region as compared to other regions. Therefore, the estimation accuracy of the temperature of the light-emitting element D1 can be improved by measuring a temperature of a region in which heat is relatively easily accumulated.

Figure 5:
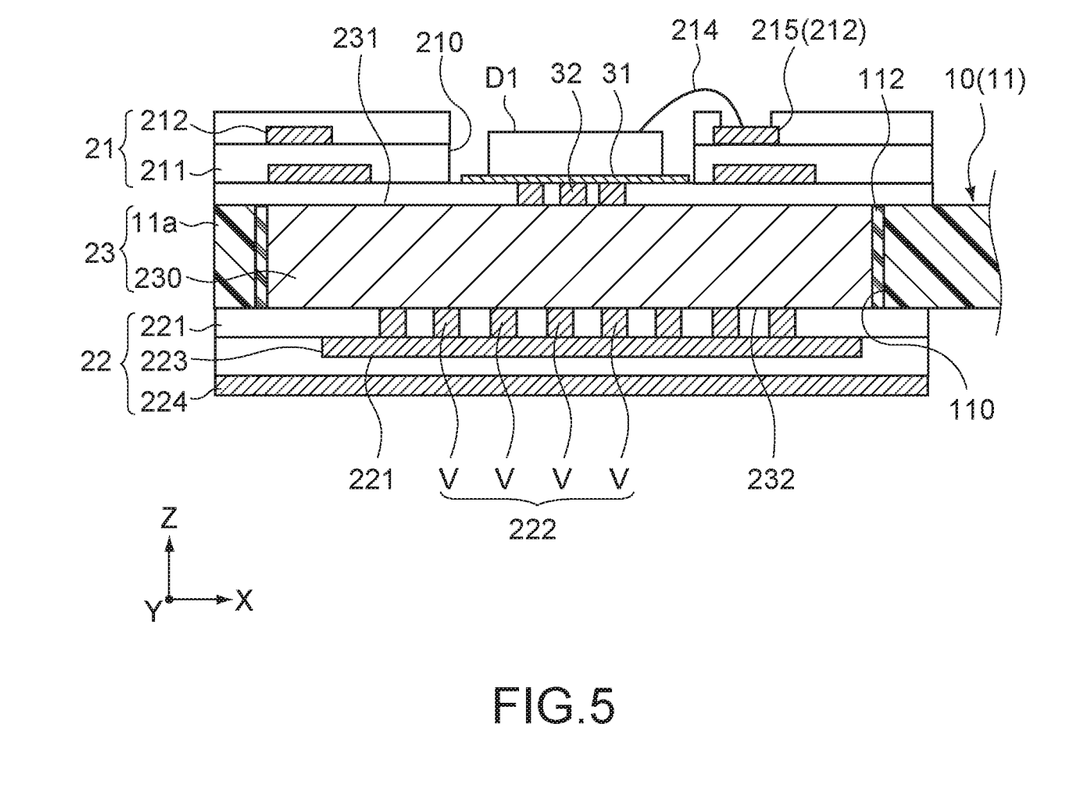
FIG. 5 is a schematic cross-sectional side view showing another configuration example of a main part in the circuit board.

Moreover, in the above-mentioned embodiment, the light-emitting element D1 is joined with the first main surface 231 of the core layer 230 via the electrically conductive layer 213, though not limited thereto. For example, as in a circuit module (second board body) shown in FIG. 5, the light-emitting element D1 may be mounted at the bottom portion of the recess 210 via a metal plate 31 such as a stainless steel. If the bottom portion of the recess 210 is the first main surface 231 of the core layer 230, the metal plate 31 functions as a thermally transmissive layer and an electrode layer that connects between the light-emitting element D1 and the core layer 230. On the other hand, in a case where the bottom portion of the recess 210 is constituted by the insulating layer 211 as shown in FIG. 5, electrical and thermal connection between the light-emitting element D1 and the core layer 230 can be made by providing a metal via 32 between the metal plate 31 and the core layer 230. It should be noted that an electrically conductive layer such as solder, a silver paste, and an electrically conductive adhesive is favorably interposed between the light-emitting element D1 and the metal plate 31. Alternatively, the light-emitting element D1 is joined with the metal plate 31 by a flip chip method.

It should be understood by those skilled in the art that various modifications, combinations, sub-combinations and alterations may occur depending on design requirements and other factors insofar as they are within the scope of the appended claims or the equivalents thereof.

What is claimed is:

1. A circuit board, comprising:
a core base material including a metal core layer having a first main surface capable of supporting a mounting component and a second main surface which is opposite to the first main surface;
a first exterior coating base material which is arranged facing the first main surface; and
a second exterior coating base material which is arranged facing the second main surface and includes a heat dissipation layer having a via which is connected to the second main surface,
wherein the first exterior coating base material includes:
a recess storing the mounting component; and
a first wiring layer that includes:
a first connection terminal that is electrically connected to the mounting component stored in the recess, and
a second connection terminal that has an area larger than an area of the first connection terminal and that is connected to at least one electrode of a temperature measurement element mounted in the first exterior coating base material,
wherein the second connection terminal is configured as a heat collecting terminal that receives heat from the core layer, and
wherein the temperature measurement element measures an amount of heat generated by driving of the mounting component.

2. The circuit board according to claim 1, wherein the via includes a plurality of via parts which are connected to a plurality of parts of the second main surface.

3. The circuit board according to claim 1, wherein the second connection terminal comprises a pair of terminals which are connected to a pair of electrodes of the temperature measurement element, and
one terminal of the pair of terminals has an area larger than an area of another terminal of the pair of terminals.

4. The circuit board according to claim 1, wherein the second exterior coating base material further includes a second wiring layer, and
the second wiring layer is arranged facing the heat dissipation layer and is electrically insulated from the core layer and the heat dissipation layer.

5. The circuit board according to claim 1, wherein the first exterior coating base material comprises a multi-layer wiring base material.

6. The circuit board according to claim 1, wherein the core base material further includes a flexible wiring member having an aperture for storing the core layer.

7. A circuit module, comprising:
a heat generating element;
a core base material including a metal core layer including
a first main surface on which the heat generating element is mounted, and
a second main surface which is opposite to the first main surface;
a first exterior coating base material which is arranged facing the first main surface, has a recess that stores the heat generating element, and includes a first wiring layer which is electrically connected to the heat generating element; and
a second exterior coating base material which is arranged facing the second main surface and includes a heat dissipation layer having a via which is connected to the second main surface,
wherein the first exterior coating base material includes:
a recess storing the heat generating element; and
a first wiring layer that includes:
a first connection terminal that is electrically connected to the heat generating element stored in the recess, and
a second connection terminal that has an area larger than an area of the first connection terminal and that is connected to at least one electrode of a temperature measurement element mounted in the first exterior coating base material,
wherein the second connection terminal is configured as a heat collecting terminal that receives heat from the core layer, and
wherein the temperature measurement element measures an amount of heat generated by driving of the heat generating element.

8. The circuit module according to claim 7, wherein the heat generating element comprises a semiconductor light-emitting element.

9. The circuit module according to claim 7, wherein the second exterior coating base material further includes a second wiring layer which is arranged facing the heat dissipation layer and is electrically insulated from the core layer and the heat dissipation layer.

* * * * *